Nov. 24, 1970 B. J. PLUNKETT 3,543,191

CONTROLLABLE FILTER NETWORK

Filed June 18, 1968 2 Sheets-Sheet 1

INVENTOR:
Bradley J. Plunkett
Kenway and Beecher
By Warren T. Jessup
ATTORNEYS

INVENTOR:
Bradley J. Plunkett
Kemp and Beecher
By Warren T. Jessup
ATTORNEYS

United States Patent Office 3,543,191
Patented Nov. 24, 1970

3,543,191

CONTROLLABLE FILTER NETWORK

Bradley J. Plunkett, Van Nuys, Calif., assignor to Warwick Electronics Inc., Chicago, Ill., a corporation of Delaware Filed June 18, 1968, Ser. No. 737,950
Int. Cl. H03h 7/10
U.S. Cl. 333—17 6 Claims

ABSTRACT OF THE DISCLOSURE

An improved controllable filter is provided of, for example, the low pass type and which has an automatically controlled cut-off frequency response characteristic. The filter of the invention has particular utility in removing harmonics from complex signals whose fundamental frequencies extend through a relatively wide frequency range, so as to produce roughly sinusoidal wave forms in response to such signals. The filter is constructed to respond to the signals translated by the filter in order to change the response characteristic for the different fundamental frequencies, and thereby to provide a desired attenuation for the harmonics of the various signals, regardless of whether their fundamental frequency lies at the high end or at the low end of the range.

BACKGROUND OF THE INVENTION

Low pass filters are well known which exhibit a particular pass band response characteristic over a particular frequency range, which characteristic drops rapidly after a particular cut-off frequency is reached. Such a filter is capable of passing signals within its pass band frequency range, and of attenuating signals above the cut-off frequency and out of the pass band range. Such a filter is useful, for example, for removing the harmonics from an applied complex signal when the fundamental frequency of the signal lies within the pass band of the filter, but the harmonic frequencies lie above the aforesaid cut-off frequency. The filter then serves effectively to transform the complex signal into a sinusoidal wave signal of the same fundamental frequency.

Problems arise, however, in filters of the above type, when a number of complex signals are applied to the filter and having different fundamental frequencies. It is clear that if the filter is designed effectively to attenuate the harmonics of signals whose fundamental frequencies lie near the high frequency end of the filter pass band, it will be ineffective in attenuating at least some of the harmonics of signals whose fundamental frequencies lie near the low end of the pass band, because at least some of the harmonics of the latter signals will also lie within the pass band of the filter. Conversely, if the filter is designed effectively to attenuate the harmonics of signals whose fundamental frequencies lie near the low end of a particular frequency range, it will attenuate not only the harmonics, but the fundamentals also, of signals near the high end of the frequency range. The problem is particularly vexing with signals which are high in second harmonics.

The filter of the present invention, as will be described, has controllable response characteristics. When an applied signal has a fundamental frequency near the high end of a selected frequency range, the filter operates "normally" to exhibit a particular cut-off frequency so as to attenuate the harmonics of that signal. However, the filter responds to the presence of a signal having a fundamental frequency near the low end of the selected frequency range, to change its response characteristic and effectively to decrease its cut-off frequency so that the harmonics of the latter signal also may be attenuated.

Although the improved filter network of the present invention has general utility, the network is particularly useful, for example, in electronic units designed to be used in conjunction with musical instruments to produce a variety of voices and different pitch levels in response to the acoustical signals produced by the instruments. In such units, the acoustical output of the musical instrument is converted into corresponding electrical signals of complex wave forms, with fundamental frequencies extending through a multi-octave frequency range. The electrical signals are then processed through pulse generating circuitry in the unit for frequency doubling and frequency dividing purposes. Although of general utility, the filter network of the present invention, for example, may be used in such a unit to strip harmonics from the complex wave forms, and thereby achieve generally sinusoidal signals that may be more expeditiously processed in the pulse generating circuitry of the unit. It is quite effective on second harmonics, where many filters have serious shortcomings.

It will be appreciated that when a low pass filter network, for example, of fixed characteristics is used in conjunction with signal frequencies extending through a relatively large frequency range, and when the purpose of the network is to remove harmonics from such signals, problems will arise as discussed previously herein. For example, when such a network is used in the aforesaid electronic unit, the input signal frequencies span approximately four octaves, and the wave forms may be strong in harmonics, depending upon the instrument. In a typical example, the high frequency cut-off slope of the filter must be greater than twelve decibels per octave to adequately remove the second and higher order harmonics from the input signals. However, this results in an attenuation of the order of 48 decibels for fundamental and harmonic signal frequencies, for example, occurring four octaves above the 120 Hz. cut-off frequency of a typical filter. Such a high degree of attenuation to the higher frequency fundamentals causes serious signal-to-noise ratio problems.

The filter circuit of the present invention successfully solves the problems set forth in the preceding paragraph. This is accomplished by including a voltage sensitive control circuit in the filter network which is capable of changing the cut-off frequency response characteristic of the filter. The control circuit is actuated by the amplitude of the signals translated through the filter. The filter normally assumes a particular cut-off frequency response characteristic to attenuate the harmonics of signals whose fundamentals lie in the medium and high frequency range of the filter. However, when lower frequency signals of any appreciable amplitude are passed through the filter network, they appear at the output with sufficient amplitude to actuate the control circuit. The actuation of the control circuit causes the cut-off frequency response characteristic to change, so as to provide the desired degree of attenuation for the harmonics of the lower frequency signals.

DETAILED DESCRIPTION OF THE ILLUSTRATED EMBODIMENTS

Figure 1:
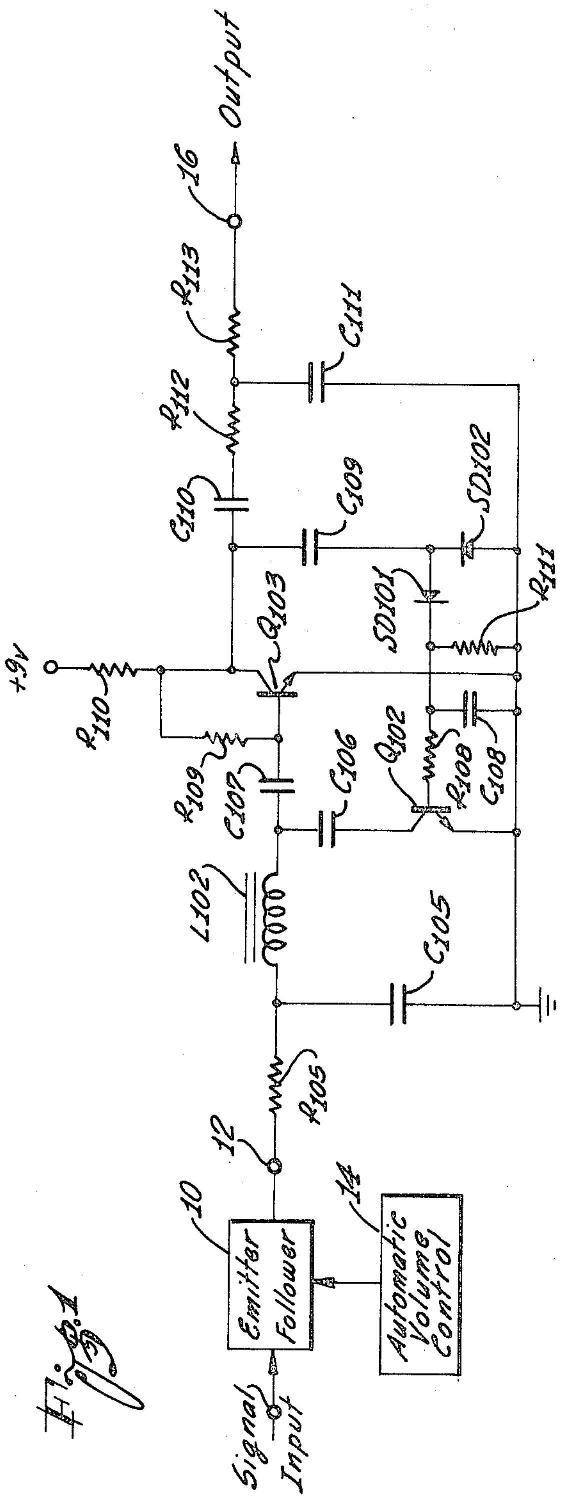
FIG. 1 is a circuit diagram showing one embodiment of the improved controllable filter network of the present invention.

The signals fed into the filter network of FIG. 1 may be passed through an emitter follower 10 to the input terminal 12 of the network. In order to maintain the amplitudes of the input signals within a controlled range, an automatic volume control 14 may be provided.

The filter network of FIG. 1 is a low pass filter. The input terminal 12 is connected to a resistor R105 which may, for example, have a resistance of 220 ohms. The resistor R105 is connected to the common junction of a grounded capacitor C105 and an inductance coil L102. The capacitor may have a capacitance of .47 microfarad, and the inductance coil may have an inductance of 8 henries.

The filter network shown in FIG. 1 includes a control circuit which, in turn, includes an NPN transistor Q102 having a grounded emitter, and having its collector connected to a capacitor C106. The capacitor C106 may have a capitance, for example, of .22 microfarad. The capacitor C106 is connected to the junction of the coil L102 and of a further capacitor C107, the latter capacitor having a capacitance of 0.15 microfarad. The capacitor C107 is connected to the base of an NPN transistor Q103 which is connected as an amplifier.

The collector of the transistor Q103 is connected to a resistor R110 having a resistance, for example, of 10 kilo-ohms, the resistor being connected to the positive terminal of a 9-volt direct voltage source, the negative terminal of which may be grounded. A resistor R109 having a resistance, for example, of 3.3 megohms, is connected between the collector of the transistor Q103 and its base.

The collector of the transistor Q103 is also connected to the junction of a pair of capacitors C109 and C110, these capacitors having capacities for example, of 0.1 and 0.027 microfarad respectively. The capacitor C109 is connected to a pair of diodes SD101 and SD102 which form a voltage doubler rectifier. These diodes, for example, may be of the silicon type, so as to exhibit a barrier threshold which must be exceeded before they may be rendered conductive. In a constructed embodiment, for example, 1.2 volts peak-to-peak is required in order to render the diodes conductive.

The diode SD102 is grounded, whereas the diode SD101 is connected through a resistor R108 to the base of the control circuit transistor Q102. The resistor R108 may have a resistance, for example, of 100 kilo-ohms. The diode SD101 is also connected to a grounded capacitor C108 and to a grounded resistor R111. The capacitor C108 may have a capacity, for example, of 0.12 microfarad, and the resistor may have a resistance of 1 megohm.

The capacitor C110 is connected to a resistor R112 which, in turn, is connected to a grounded capacitor C111 and to a further resistor R113, the latter resistor being connected to the output terminal 16 of the network. The resistor R112 may have a resistance of 4.7 kilo-ohms, the capacitor C111 may have a capacity of .01 microfarad, and the resistor R113 may have a resistance of 10 kilo-ohms.

Figure 2:
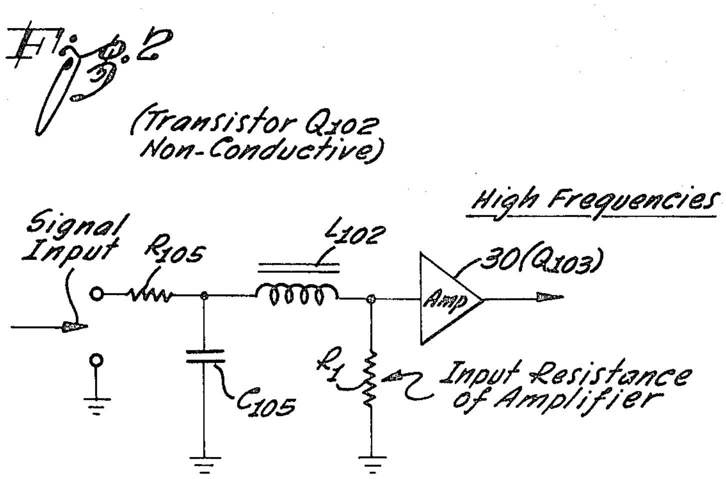
FIG. 2 is an equivalent circuit of the network of FIG. 1, when the network is in one operational mode.
Figures 2A, 3:
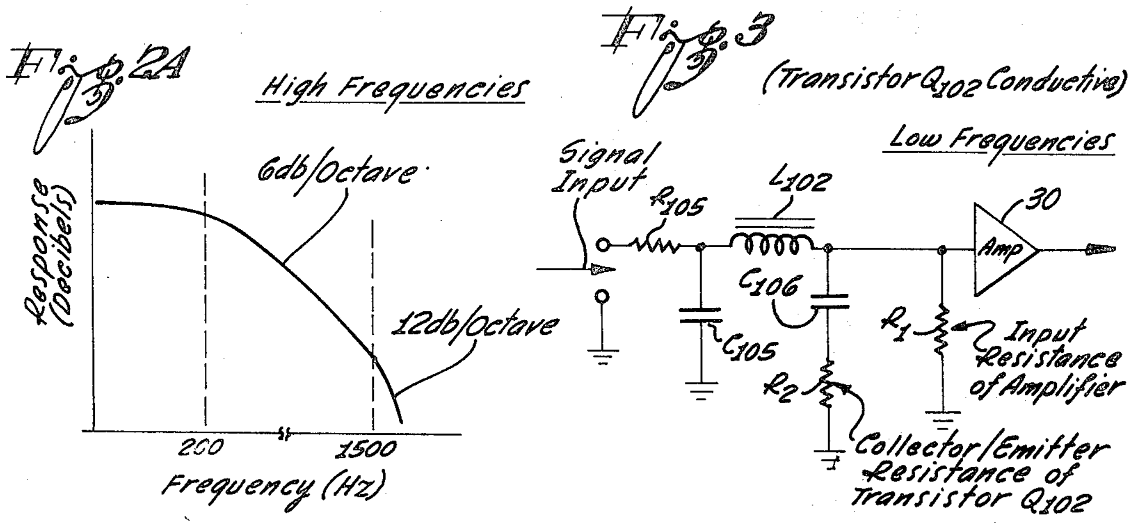
FIG. 2A is a curve showing the response characteristic of the filter network in the operating mode represented by the equivalent circuit of FIG. 2.
FIG. 3 is an equivalent circuit of the filter network of FIG. 1, when the filter network is in a second operating mode.

The amplifier formed by the transistor Q103 is designated as 30 in the equivalent circuits shown in FIGS. 2 and 3, with the input resistance of the amplifier being designated $R_1$, this resistance being of the order, for example, of 10 kilo-ohms. The collector/emitter resistance of the transistor Q102 is designated $R_2$ in the equivalent circuit of FIG. 3.

The transistor Q102 is normally biased to be non-conductive, so that the filter network of FIG. 1 may be represented by the equivalent circuit of FIG. 2. The filter network has the characteristics represented by the equivalent circuit of FIG. 2 for high frequency signal frequencies. Such signal frequencies are sufficiently attenuated by the filter network so that the resulting signal amplitude at the output of the amplifier 30 is insufficient to cause conduction of the diodes SD101 and SD102.

Assuming, for example, a signal of 0.1 volt at the input terminals 12 having a fundamental frequency of 1000 Hz., the resulting signal at the collector of the transistor Q103, that is at the output of the amplifier 30 of FIG. 2, will be around 0.1 volt. This is not sufficient to cause conduction of the diodes SD101 and SD102. Therefore, the transistor Q102 is non-conductive.

The response characteristic of the filter network in the presence of such a high frequency signal is as shown in FIG. 2A. As shown in FIG. 2A, for example, the filter starts to cut-off at 200 Hz., and the response characteristic thereafter drops at the rate of 6 decibels per octave. This continues until a frequency of 1500 Hz., is reached, at which time the downward slope of the response characteristic increases to 12 db per octave. For signals with relatively high fundamental frequencies, sufficient attenuation is provided by the response characteristic curve of FIG. 2A for the second and other higher harmonics of such signals. However, the filter is not effective insofar as the harmonics of signals of lower fundamental frequencies are concerned.

Assume, for example, a low frequency signal having a fundamental freqeuncy of the order, for example, of 150 Hz. at the input terminals 12, and also having an amplitude of the order of 0.1 volt. This latter signal will be passed by the filter network in a relatively unattenuated state, and a corresponding output signal may be produced at the collector of the transistor Q103, as large as 4–6 volts peak-to-peak. This latter amplitude is sufficient to cause the diodes SD101 and SD102 to conduct and thereby produce a direct current voltage across the capacitor C108.

The voltage across the capacitor C108 is applied to the transistor Q102 through the resistor R108. This causes the transistor to conduct, and it becomes a low resistance path to ground for the capacitor C106. The capacitor C106 is thereby connected into the filter network, as shown by the equivalent circuit of FIG. 3. The filter now starts to cut-off around 120 Hz., after a slight resonant peak, and the drop of the response characteristic slope is increased to 12 decibels per octave above that frequency, this continuing to around 1500 Hz., at which point the drop of the slope is further increased to 18 decibels per octave. The filter, therefore, is returned when the transistor Q102 is made conductive for optimum low frequency performance, providing a good response characteristic slope at the low frequencies for adequate attenuation of the harmonics thereof.

Thus, assuming a given peak-to-peak voltage, signals of higher fundamental frequencies are sufficiently attenuated by L102 and C105 that the transistor Q102 is non-conductive, and the filter network of FIG. 1 assumes the characteristics shown by the equivalent circuit of FIG. 2 and by the curve of FIG. 2A. On the other hand, for signals of the given peak-to-peak voltage having a fundamental below a predetermined frequency, the transistor Q102 is fully conductive, and the filter network of FIGURE 1 assumes the characteristic designated by the equivalent circuit of FIG. 3, and by the accompanying response characteristic of FIG. 3A.

Figure 3A:
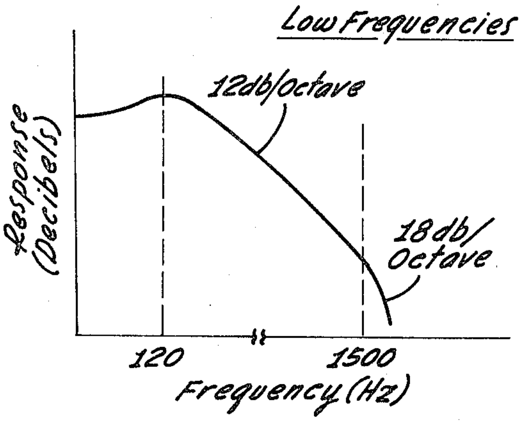
FIG. 3A shows the response characteristic of the filter network when in the operating mode designated by the equivalent circuit of FIG. 3.

For signals whose fundamental frequencies lie between the two limits shown by the curves of FIGS. 2A and 3A, the transistor Q102 is controlled so that the resistance $R_2$ of FIG. 3 changes from a maximum to a minimum value, and the response characteristics change according, so as to optimize the network for the various signal frequencies in the range between the two limits discussed above. That is, for a constant 0.1 volt input signal, for example, at the input terminal 12, as the fundamental frequency is increased, the transistor Q102 will effectively become a higher and higher resistance until at about 350 Hz., the capacitor C106 is effectively out of the circuit and the cut-off frequency of the filter shifts upward to around 500 Hz.

When the transistor Q102 is non-conductive, the input signal looks into a low pass filter formed by the resistor R105 and capacitor C105, and by the inductance coil L102 and the resistance R1, as shown in FIG. 2. This condition serves for the high frequency signal frequencies. However, for the low frequency signals, the transistor Q102 is rendered conductive, and such signals looking into an additional low pass filter formed by the inductance coil L102 and capacitor C106, as shown in FIG. 3.

Figure 4:
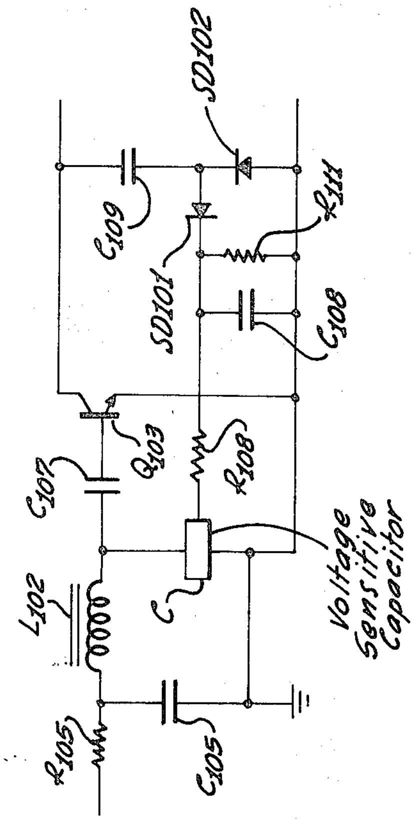
FIG. 4 is a fragmentary circuit of a second embodiment of the filter network.

A second embodiment of the invention is shown in FIG. 4, and like components have been designated by the same numbers in the latter circuit. The circuit of FIG. 4 is shown in fragmentary form, and it may incorporate additional circuitry shown in more detail by the circuit of FIG. 1.

In FIG. 4, the capacitor C106 and transistor Q102 of FIG. 1 are replaced by a voltage sensitive capacitor designated C. Such capacitors are well known to the art, and they respond to varying applied voltages to change their capacity. The capacity C may be controlled in the same manner as the transistor Q102 in the previous embodiment, so as to change the characteristics of the filter, as before, as the diodes SD101 and SD102 are rendered conductive.

It will be appreciated that although the filter circuit of the present invention has been described as a particular filter with particular constants, other equivalent circuits may be constructed which embody the concepts of the invention. Also, although the filter network of the invention has been suggested as suitable for use in a particular type of electronic unit, it has general utility whenever such a controllable filter is required.

Therefore, the following claims are presented with a scope intended to cover the various embodiments which fall within the spirit of the invention.

What is claimed is:

1. In combination:

a low-pass filter for passing essentially the fundamentals of input signals and for discriminatorily attenuating the harmonics of such signals, which signals have respective fundamental components extending over a predetermined frequency range, said filter having a predetermined amplitude vs. frequency response characteristic which normally has a predetermined downward slope through said range;

controllable means coupled to said filter for changing said characteristic in response to an applied control signal; and a control circuit having an input coupled to the output of said filter and responsive to output signals translated by said filter for developing a control signal, said control circuit having output means coupled to said controllable means for applying a control signal thereto, to significantly steepen said downward slope through said range, in response to application to the filter of fundamental frequencies in the lower region of said frequency range.

2. The combination defined in claim 1, in which said control circuit includes threshold means for rendering said control circuit responsive only to output signals which appear at the output of said filter with an amplitude exceeding a predetermined minimum.

3. The combination defined in claim 2, in which said threshold means includes a pair of diodes connected as a voltage-doubler rectifier.

4. The combination defined in claim 1, in which said controllable means includes a series-connected capacitor and transistor connected in shunt across the filter and in which said control circuit applies said control signal to said transistor to control the conductivity thereof.

5. The combination defined in claim 1, in which said controllable means includes a voltage-sensitive capacitor.

6. In combination:

a low-pass filter for passing essentially the fundamentals of input signals and for discriminatorily attenuating the harmonics of such signals, which signals have respective fundamental components extending over a predetermined frequency range, said filter having a predetermined amplitude vs. frequency response characteristic which normally has a predetermined downward slope through said range, and has, above said range, a high-frequency downward slope which is significantly greater than said predetermined downward slope;

controllable means coupled to said filter for changing said characteristic in response to an applied control signals; and a control having an input coupled to the output of said filter and response to output signals translated by said filter for developing a control signal, said control circuit having output means coupled to said controllable means for applying a control signal thereto, and including means for significantly steepening both said predetermined downward slope within said range, and said high-frequency downward slope above said range, in response to application to the filter of fundamental frequencies in the lower region of said frequency range.

References Cited

UNITED STATES PATENTS

| | | | |
|---|---|---|---|
| 2,606,969 | 8/1952 | Scott | 333—70 X |
| 2,606,971 | 8/1952 | Scott | 333—70 X |

PAUL L. GENSLER, Primary Examiner

U.S. Cl. X.R.

333—70